United States Patent
Koveshnikov

(10) Patent No.: US 6,794,227 B2
(45) Date of Patent: Sep. 21, 2004

(54) METHOD OF PRODUCING AN SOI WAFER

(75) Inventor: Sergei V. Koveshnikov, Vancouver, WA (US)

(73) Assignee: SEH America, Inc., Vancouver, WA (US)

( * ) Notice: Subject to any disclaimer, the term of this patent is extended or adjusted under 35 U.S.C. 154(b) by 214 days.

(21) Appl. No.: 10/186,942

(22) Filed: Jun. 28, 2002

(65) Prior Publication Data

US 2004/0002200 A1 Jan. 1, 2004

(51) Int. Cl.[7] .............................................. H01L 21/00
(52) U.S. Cl. ........................................ 438/149; 438/150
(58) Field of Search ................................ 438/149–152

(56) References Cited

U.S. PATENT DOCUMENTS

| | | | |
|---|---|---|---|
| 4,889,829 A | * 12/1989 | Kawai | 438/405 |
| 5,045,488 A | 9/1991 | Yeh | |
| 5,376,579 A | 12/1994 | Annamalai | |
| 5,650,353 A | 7/1997 | Yoshizawa et al. | |
| 5,998,281 A | 12/1999 | Aga et al. | |
| 6,140,210 A | 10/2000 | Aga et al. | |
| 6,224,668 B1 | 5/2001 | Tamatsuka | |
| 6,238,990 B1 | 5/2001 | Aga et al. | |
| 6,239,004 B1 | 5/2001 | Aga et al. | |
| 6,245,645 B1 | 6/2001 | Mitani et al. | |
| 6,284,629 B1 | 9/2001 | Yokokawa et al. | |
| 6,306,730 B2 | 10/2001 | Mitani et al. | |
| 6,362,076 B1 | 3/2002 | Inazuki et al. | |
| 6,372,609 B1 | 4/2002 | Aga et al. | |
| 6,376,337 B1 | 4/2002 | Wang et al. | |
| 6,428,619 B1 | 8/2002 | Koya et al. | |
| 2002/0034864 A1 | 3/2002 | Mizushima | |

FOREIGN PATENT DOCUMENTS

| | | |
|---|---|---|
| DE | 100 52 411 A1 | 5/2002 |
| EP | 1 102 314 A2 | 5/2001 |

* cited by examiner

Primary Examiner—H. Jey Tsai
(74) Attorney, Agent, or Firm—Douglas G. Anderson

(57) ABSTRACT

A semiconductor wafer manufacturing is disclosed wherein an SOI wafer is produced by annealing a polysilicon layer deposited on a substrate wafer in an oxygen-containing ambient, and annealing the wafer at high temperatures to form an oxide layer at the interface of the substrate wafer and polysilicon layer. During the high temperature anneal, the polycrystalline silicon layer also recrystallizes to a monocrystalline state, and replicates the lattice structure of the substrate wafer.

19 Claims, 2 Drawing Sheets

METHOD OF PRODUCING AN SOI WAFER

FIELD OF THE INVENTION

The present invention relates to a method of manufacturing an SOI (silicon-on-insulator) substrate wafer for use in the microelectronics industry. More particularly, the invention relates to a method of producing an SOI wafer by depositing a polysilicon layer on a substrate wafer, annealing this wafer in pure or dilute oxygen ambient, and recrystallizing the amorphous or polysilicon layer to become monocrystalline through high temperature annealing.

BACKGROUND OF THE INVENTION

Conventionally, there are two popular methods of fabricating wafers having an SOI structure. One method is a SIMOX method (separation by implanted oxygen), wherein a high concentration of oxygen atoms are implanted into a substrate wafer, and the wafer is then subjected to a high temperature heat treatment process to induce the implanted oxygen to form an oxide layer. The other method involves wafer bonding, wherein two wafers, both having a mirror polished finish and at least one containing an oxide layer on the surface to be bonded, are bonded together without the use of adhesive, and one of the wafers is then subjected to a thinning step.

In the SIMOX method, the thickness of the SOI layer, which will become the active device layer, is controlled by controlling the voltage of the implanting equipment. The advantage of the SIMOX process is that the thickness uniformity of the layer is easily controlled. The SIMOX process is expensive however, and is limited to single-wafer processing.

In the wafer bonding techniques, two silicon wafers are produced through standard wafer processing steps up to and including mirror polishing at least the surfaces to be bonded together. At least one of the wafers containing the mirror polish is subjected to an oxidation process. The two mirror-polished surfaces, at least one containing the oxide layer, are then brought into contact with each other, and the wafers are subjected to a thermal treatment cycle to increase the bonding strength. Subsequently one of the wafers is subjected to a thinning process. This thinning step can be accomplished by surface grinding or chemical etching, typically followed by a polishing step to ensure the surface of the thinned wafer is sufficiently smooth to ensure proper utilization in the device fabrication processes. This thinning process has several significant disadvantages, however. First, the thinning process is quite time consuming and costly to perform. Up to several hundred microns of material must be removed and disposed of in order get an SOI layer of a usable thickness. The thinning methods also have limitations in controlling the thickness uniformity of the thinned SOI layer, due in large part to limitations in the mechanical machining equipment used. Second, a large amount of silicon is wasted due to the thinning process, where the vast majority of material of one of the bonded wafers is simply removed and disposed of.

A significant improvement on the bonding method, known as the Smart-Cut method, has recently drawn attention. In this method, one of the two wafers to be bonded is subjected to ion implantation wherein hydrogen ions and rare gas ions are implanted at high levels such that a bubble layer exists within the wafer that is to become the SOI layer. Again, at least one of the wafer surfaces is subjected to an oxide formation step. The wafers are then bonded together through a thermal process. The thermal process in this case not only assists in bonding the two surfaces together, but also serves to assist in delaminating the ion implanted wafer at the plane of the implantation. The bonded wafer is then left with an oxide layer, and a thin silicon layer from the ion implanted wafer. The remains of the ion-implanted wafer can then be repolished and reused, or simply discarded. Obviously, cost savings and time savings are realized by the elimination of a grinding or etching thinning step. The surface of the bonded wafer is then treated to a touch polish or surface termination step to improve the surface roughness of the SOI layer.

One significant problem that occurs with any of the above-mentioned techniques revolves around the use of CZ, or Czochralski grown crystals. A wafer produced by the CZ method usually contains a defect known as COP (Crystal Originated Particles), which originate during crystal growth, and remain in crystal during the wafering stages of manufacture. Since COP defects remain in crystal, attempts have been made to grow an epitaxial layer on the surface of the wafer to be bonded, with the anticipation of grinding or removing the entire substrate wafer, such that only the epitaxial layer becomes the SOI layer. This added step provides a high quality silicon for the SOI layer, but costs even more than standard bonding techniques in both processing time and equipment, and is still limited to the quality of the thinning process with respect to surface thickness and thickness uniformity.

Another problem that may occur with wafers produced using the CZ technique is related to the oxygen concentration trapped in the crystal growth. To circumvent this problem, wafers manufactured from crystals grown using the FZ (Float Zone) technique have been used. Because of the different method of crystal growth, there is very little oxygen concentration within a crystal manufactured using the FZ technique. However, the design limitations of the FZ technique make it increasingly difficult, if not impossible, to grow crystals of large diameter such as 200 mm or 300 mm. This limitation does not make FZ an attractive alternative, due to the trend of increasing crystal diameters used.

Each method and/or wafer type described above has various advantages and disadvantages over the other techniques mentioned. The present invention has been accomplished to provide a method of manufacturing an SOI wafer that eliminates the problems associated with COP defects and oxygen, increase productivity over the known methods while reducing costs, and provide a high quality SOI layer.

SUMMARY OF THE INVENTION

The present invention relates to fabricating a buried oxide or oxynitride layer found in SOI wafers. In the method of the present invention, a substrate wafer is prepared through standard wafering techniques up to and including polishing at least one surface of the wafer. The polished wafer surface is then cleaned using standard SC1/SC2 cleaning methods to remove any native oxide layers and to clean the surface. A polysilicon layer is then grown on the polished surface of the substrate wafer, with the thickness of the polysilicon layer being controlled by deposition time and temperature. An anneal in oxygen ambient is then performed to accumulate oxygen, and nitrogen if desired, in the buried layer at the interface between the polished surface of the substrate wafer and the polysilicon layer. Finally, a high-temperature anneal in an oxygen/argon ambient gas mixture is used to form the buried oxide layer.

Various embodiments of the present invention provide that any of the steps utilized (cleaning, deposition of polysilicon, oxidation, or high temperature annealing) can be accomplished in batch production or in single wafer production equipment, and may be accomplished in any combination thereof.

According to the method of the present invention, SOI wafers having good thickness uniformity and excellent quality can be provided. Similarly, the cost of producing excellent quality SOI wafers can be significantly reduced by employing various embodiments of the present invention.

DETAILED DESCRIPTION OF THE INVENTION

The present invention will now be described more fully hereinafter, in which preferred embodiments of the invention are shown. This invention may, however, be embodied in many different forms and should not be construed as limited to the embodiments set forth herein. These embodiments are provided so that the disclosure will convey the scope of the invention to those skilled in the art.

Figure 1:
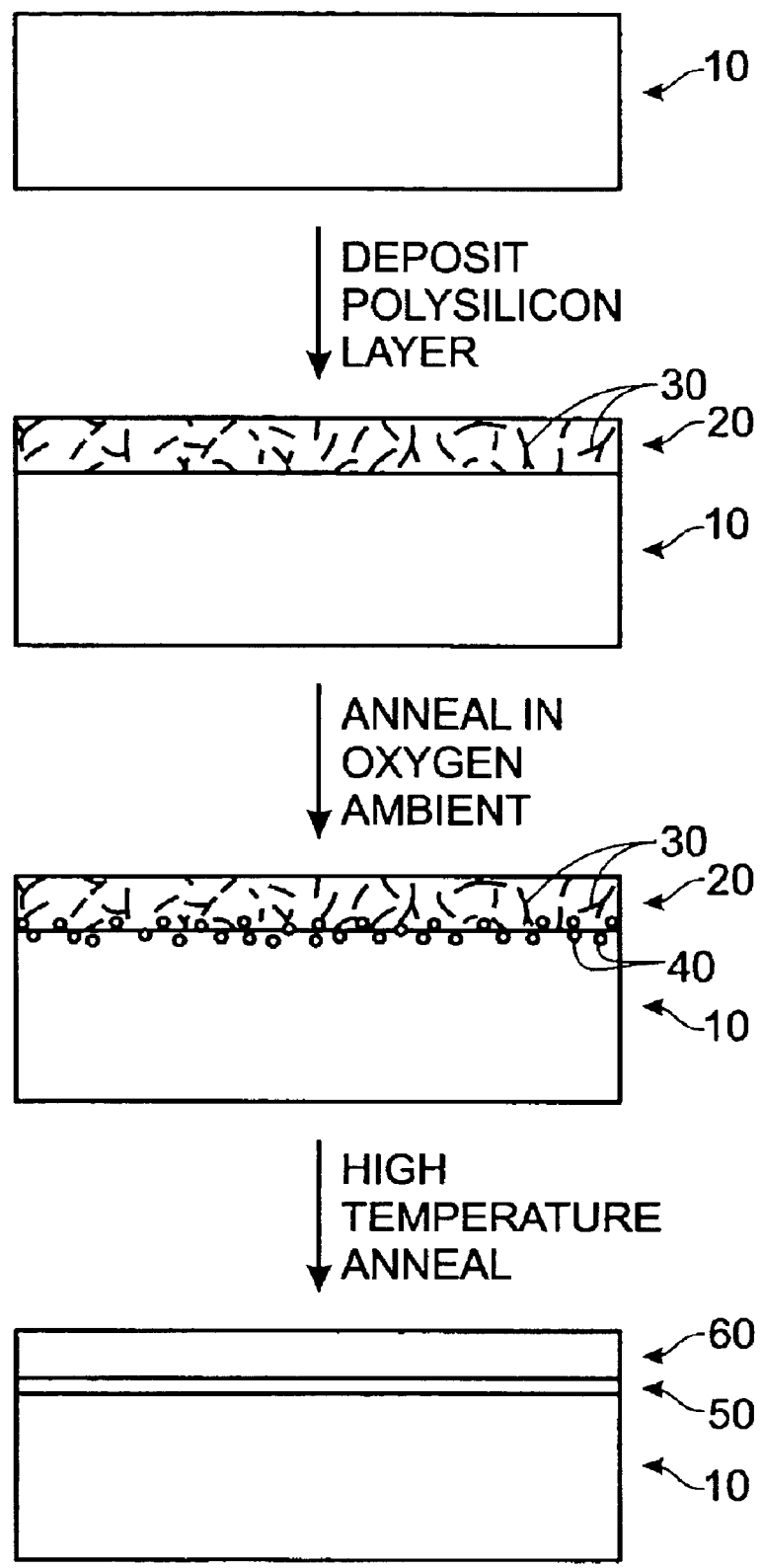
FIG. 1 depicts a process flow of one embodiment of the present invention.

Turning now to FIG. 1, a semiconductor wafer, such as a silicon wafer, is prepared through standard wafer shaping techniques including slicing the wafer from a crystal ingot, chamfering the periphery of the wafer, lapping or surface grinding the front and back surfaces, chemically etching the surfaces, and polishing at least one surface of the wafer to a complete or mirror polish. Multiple cleaning steps, optional identification marking steps, and/or inspection steps may be performed as desired during these steps. Upon polishing at least one side of the wafer, the wafer is subjected to a cleaning using a standard RCA chemical cleaning. Such a cleaned wafer is depicted at 10 in FIG. 1. RCA cleaning comprises a first bath containing a mixture of water, hydrogen peroxide, and ammonium hydroxide (also known as SC1) followed by a bath containing a mixture of water, hydrogen peroxide, and hydrochloric acid (also known as SC2). The SC1 bath removes organic contaminants as well as some Group I and Group II metals, and the SC2 bath removes alkali and transition metals.

The substrate wafer 10 is then subjected to a process to grow a polysilicon layer 20 on at least one surface of the substrate wafer 10. The polysilicon layer 20 contains grain boundaries, illustrated as 30. The polysilicon layer 20 can be deposited using any known deposition technique, including single or multiple wafer equipment, and including Low Pressure Chemical Vapor Deposition (LPCVD), Plasma Enhanced Chemical Vapor Deposition (PECVD), or other techniques. Commonly, the polysilicon layer 20 is deposited by the LPCVD technique, at a pressure of approximately one Torr, and in a temperature range of 600° C. to 650° C. The thickness of the polysilicon layer 20 is determined by the deposition time at the given temperature and technique used. The desired thickness of the layer is determined by the application of the SOI device to be manufactured. Typically the layer will be thin, however, on the order of 0.1 to 0.5 microns.

Figure 2:
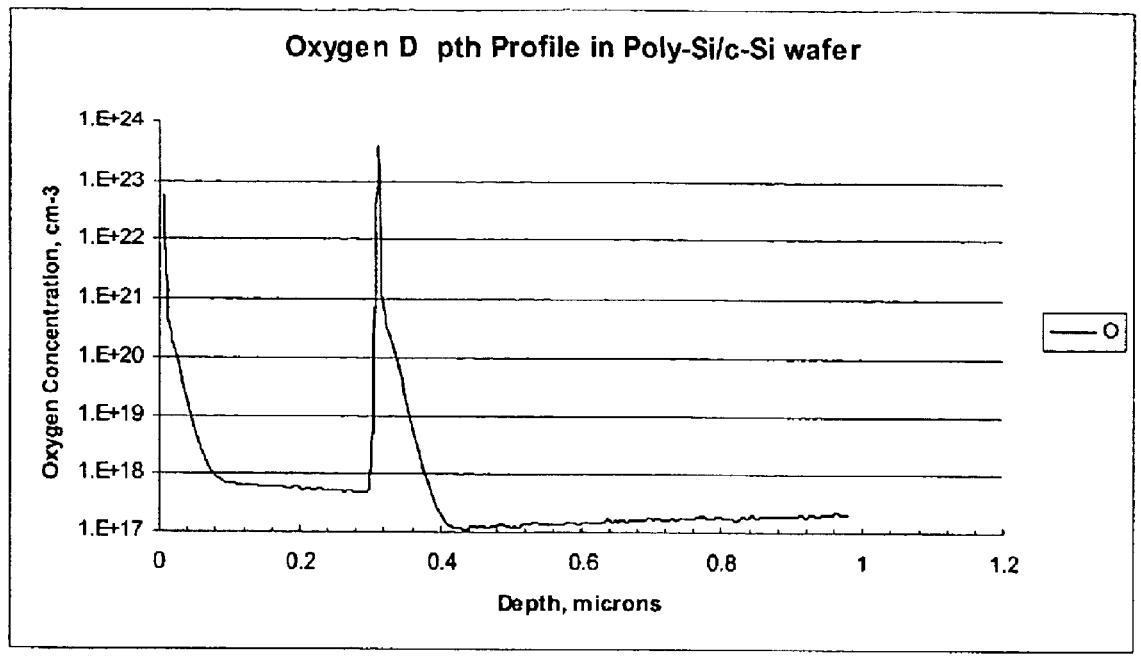
FIG. 2 shows a depth profile for oxygen concentration in a silicon wafer containing a polysilicon layer 0.3 microns thick.

The substrate wafer 10 containing the polysilicon layer 20 is then subjected to an anneal in pure or dilute oxygen ambient, wherein oxygen diffuses into the polysilicon layer 20, and is collected at the interface between the polysilicon layer 20 and the surface of the substrate wafer 10. In typical as-grown silicon crystals, the oxygen concentration is in the range of $5\text{--}10\mathrm{e}^{17}$ atoms/cm$^3$. At temperatures in the range of 600–1200° C., oxygen is typically in a state of supersaturation. There is therefore a tendency for precipitation to occur at nucleation sites, such as the interface between the polysilicon layer 20 and the surface of the substrate wafer 10. At the temperature range of 800–1100° C., the diffusion coefficient of oxygen in silicon is in the range of $10^{-13}\text{--}10^{-10}$ cm$^2$/s. Therefore, a heat treatment in the range of 800–1100° C. in an oxygen ambient will contribute to, and result in, oxygen precipitating that the interface between the substrate wafer 10 and the polysilicon layer 20, and from the surface into the substrate wafer. As shown in FIG. 2, the oxygen concentration, as measured by SIMS, the oxygen concentration at the surface of the polysilicon layer is approximately $8\mathrm{e}^{22}$, and rapidly drops to about $8\mathrm{e}^{17}$ for the remainder of the polysilicon layer. At the interface between the polysilicon layer and the substrate wafer surface, the oxygen concentration immediately spikes to approximately $5\mathrm{e}^{23}$ atoms/cm$^3$, and then trails back off to levels near $1\mathrm{e}^{17}$ atoms/cm$^3$ again. This clearly demonstrates the ability to get very high concentrations of oxygen at the interface.

Further, the relative width of the oxygen-rich region is dependent upon the duration of the oxidation heat treatment step. As such, the width of the oxygen-rich band can be adjusted as desired for any particular SOI application.

It is conceived that this step of manufacturing the SOI wafer can also be accomplished by any known heat treatment techniques, including single wafer and batch wafer equipment. This includes, but is not limited to, the equipment used in the polysilicon layer deposition step listed above.

Finally, the substrate wafer 10, containing the polysilicon layer 20 and excess oxygen concentration 40, as indicated in FIG. 1, is subjected to a high temperature annealing step. This annealing cycle may range anywhere from 1200° C. to 1400° C. for a duration of between two and 12 hours. One common annealing cycle that may be used utilizes a temperature of 1300° C. for six hours. While annealing at higher temperatures may allow for shorter annealing times, they are not generally practical due to difficulty in maintaining the lattice structure of the substrate silicon at such high temperatures.

This high temperature annealing step allows the oxygen precipitates trapped at the interface between the substrate wafer 10 and the polysilicon layer 20 to redistribute and form a sharp, concentrated level of oxygen, that, when cooled becomes a distinct insulating oxide layer, depicted as 50 in FIG. 1. Also during this high temperature anneal, the polycrystalline layer 20 can is sufficiently unstable that it is able to re-crystallize into a monocrystalline layer 60 having the same crystal lattice as that of the substrate wafer. The gas ambient used in this annealing process can be a mixture of oxygen and argon, with the concentration of oxygen generally being low, on the order of 2% or less.

Figure 3:
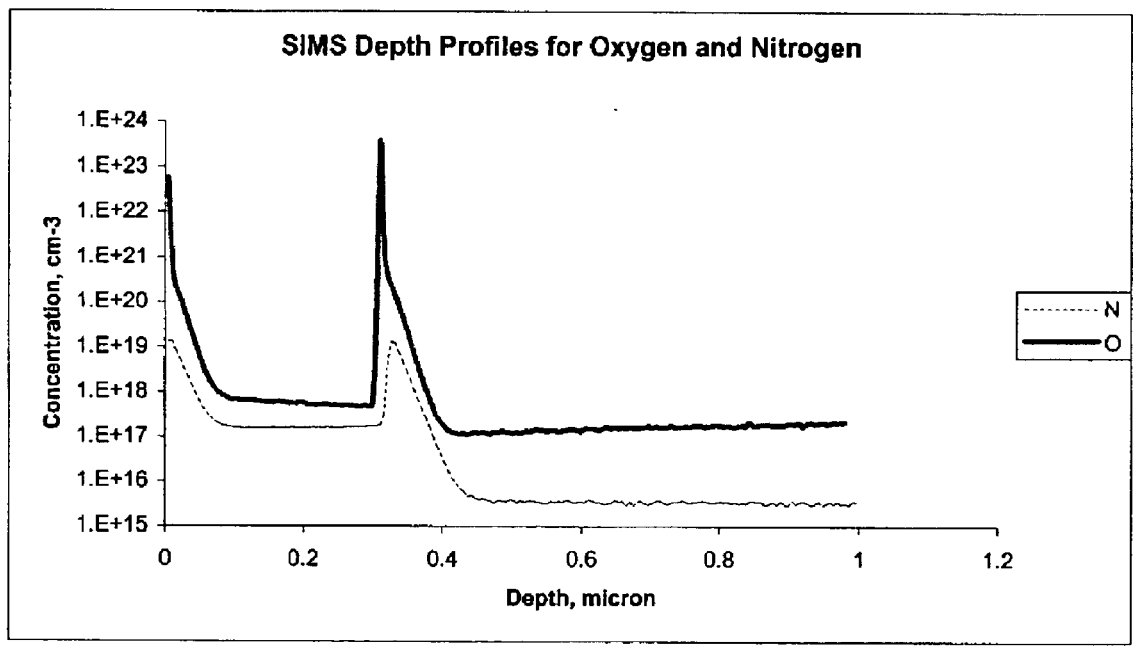
FIG. 3 shows a depth profile for oxygen and nitrogen concentrations in a silicon wafer containing a polysilicon layer 0.3 microns thick.

Again, it is conceivable that this process step can be performed in either single or batch wafer processing equipment. It should also be noted that although oxygen has been the only insulator described above, this invention also considers and includes the addition of other substances as well. For example, in the oxidation step, a mixture of oxygen and nitrogen could be substituted for oxygen as disclosed above. In this instance, the end result wafer would then contain an oxynitride layer as the insulating layer, as shown in FIG. 3.

In another embodiment of the present invention, the substrate wafer may be subjected to an additional cleaning step to remove any native oxide that may develop on the surface of the polysilicon layer before the high temperature anneal. Removal of the native oxide will help prevent additional oxygen diffusing into the recrystallized silicon layer. As desired, it may be advantageous to strip any native oxide from the surface of the recrystallized silicon layer after the high temperature annealing step, again to help control additional in-diffusion of oxygen.

Various other changes could be made to any or all embodiments of the above-described invention while still falling within the inventive scope herein. As such, those skilled in the art can carry out modifications to the specifically disclosed embodiments without departing from the scope or spirit of the present invention, which is intended to be limited only by the scope of the appended claims.

What is claimed is:

1. A method of producing an SOI wafer, comprising:
   polishing at least one surface of a silicon semiconductor substrate wafer, the substrate wafer having a monocrystalline lattice structure;
   cleaning the polished surface of the substrate wafer;
   depositing a polysilicon layer on the polished surface of the substrate wafer;
   annealing in an oxygen-containing ambient; and
   performing a high-temperature annealing step, wherein the oxygen introduced during oxidizing forms a insulation layer, and wherein the polysilicon layer recrystallizes into a monocrystalline structure having the same lattice structure as the substrate wafer.

2. The method of producing an SOI wafer according to claim 1, wherein the cleaning of the polished surface of the substrate wafer comprises an RCA cleaning.

3. The method of producing an SOI wafer according to claim 1, wherein the polysilicon layer is deposited by chemical vapor deposition.

4. The method of producing an SOI wafer according to claim 1, wherein the polysilicon layer is deposited by low-pressure chemical vapor deposition.

5. The method of producing an SOI wafer according to claim 1, wherein the polysilicon layer is deposited by plasma-enhanced chemical vapor deposition.

6. The method of producing an SOI wafer according to claim 1, wherein the polysilicon layer is deposited in single-wafer processing equipment.

7. The method of producing an SOI wafer according to claim 1, wherein the polysilicon layer is deposited in batch-wafer processing equipment.

8. The method of producing an SOI wafer according to claim 1, wherein the oxygen-containing ambient is a pure oxygen ambient.

9. The method of producing an SOI wafer according to claim 8, wherein the annealing temperature is between 800° C. and 1100° C.

10. The method of producing an SOI wafer according to claim 8, wherein the polysilicon layer is subjected to annealing in an oxygen-containing ambient for less than 100 hours.

11. The method of producing an SOI wafer according to claim 10, wherein the duration of annealing in an oxygen-containing ambient is between 1 hour and 4 hours.

12. The method of producing an SOI wafer according to claim 8, wherein the annealing in an oxygen-containing ambient is performed in a dilute oxygen ambient.

13. The method of producing an SOI wafer according to claim 8, wherein the oxidizing annealing is performed in a nitrogen containing ambient.

14. The method of producing an SOI wafer according to claim 1, wherein the insulating layer is a silicon oxide layer.

15. The method of producing an SOI wafer according to claim 1, wherein the insulating layer is an oxynitride layer.

16. The method of producing an SOI wafer according to claim 1, wherein the high-temperature annealing step is performed at a temperature between 1200° C. and 1400° C.

17. The method of producing an SOI wafer according to claim 16, wherein the high-temperature annealing step is performed at a temperature between 1300° C. and 1350° C.

18. The method of producing an SOI wafer according to claim 1, wherein the high-temperature annealing step is performed for 12 hours or less.

19. The method of producing an SOI wafer according to claim 18, wherein the high-temperature annealing step is performed for between 4 and 7 hours.

* * * * *